United States Patent [19]
Van den Bogaert et al.

[11] Patent Number: 5,925,890
[45] Date of Patent: Jul. 20, 1999

[54] APPARATUS FOR RECORDING AND READING OUT A PATTERN OF PENETRATING ELECTROMAGNETIC RADIATION

[75] Inventors: Jan Van den Bogaert, Schilde; Luc Struye, Mortsel, both of Belgium

[73] Assignee: Agfa-Gevaert N.V., Mortsel, Belgium

[21] Appl. No.: 08/829,810

[22] Filed: Mar. 27, 1997

Related U.S. Application Data

[63] Continuation-in-part of application No. 08/657,550, Jun. 4, 1996, abandoned.

[30] Foreign Application Priority Data

Jun. 8, 1995 [EP] European Pat. Off. .............. 95201505

[51] Int. Cl.$^6$ .......................... H01L 31/0272; G01T 1/16
[52] U.S. Cl. ...................... 250/580; 250/591; 250/370.09
[58] Field of Search .................................. 250/580, 591, 250/370.09

[56] References Cited

U.S. PATENT DOCUMENTS

| | | |
|---|---|---|
| 3,069,551 | 12/1962 | Haine . |
| 3,642,470 | 2/1972 | Tavernier et al. . |
| 4,508,966 | 4/1985 | Oberschmid et al. . |
| 4,542,405 | 9/1985 | Arnold et al. . |
| 4,554,453 | 11/1985 | Feigt et al. . |
| 4,666,735 | 5/1987 | Hoover et al. . |
| 4,818,857 | 4/1989 | Micheron et al. . |
| 4,827,136 | 5/1989 | Bishop, Jr. et al. . |
| 5,065,866 | 11/1991 | Boutet et al. . |
| 5,166,524 | 11/1992 | Lee et al. . |
| 5,168,160 | 12/1992 | Jeromin et al. . |
| 5,196,702 | 3/1993 | Tsuji et al. . |
| 5,440,146 | 8/1995 | Steffen et al. . |
| 5,510,626 | 4/1996 | Nelson et al. . |

FOREIGN PATENT DOCUMENTS

| | | |
|---|---|---|
| 0338091 | 10/1989 | European Pat. Off. . |
| 0748115 | 12/1996 | European Pat. Off. . |
| 1368374 | 6/1964 | France . |
| 117757 | 1/1976 | Germany . |

OTHER PUBLICATIONS

Research Disclosure; Jun. 1983, No. 230, pp. 229–231. 23027 "Method and Device for Recording and Transducing an Electromagnetic Energy Pattern". Anonymous.
Research Disclosure; Apr. 1985, No. 252, pp. 192–194. 25235 "Method and Device for the Recording of X–ray Images and Their Transformation into Electrical Signals". Anonymous.
Research Disclosure; May 1993/313. 34952 "Radiographic Liquid Crystal Display". Joannes van den Bogaert.
Research Disclosure; Nov. 1992/825/826. 34329 "Radiographic Process Utilizing an Electrolurminescent Solid––State Imager." Joannes Van den Bogaert.
Research Disclosure; Oct. 1992/772. 34264 "Radiographic process Utilizing a Photoconductive Solid–State Imager." Joannes Van den Bogaert.

*Primary Examiner*—Constantine Hannaher
*Attorney, Agent, or Firm*—Baker & Botts, L.L.P.

[57] ABSTRACT

An apparatus for recording X-ray images having a panel-like X-ray recording device removably enclosed within a cassette housing. The X-ray recording device includes a first electrode transparent to X-ray radiation, a first photoconductive layer sensitive to X-ray radiation disposed beneath the first electrode, a second photoconductive layer sensitive to visible light disposed beneath the first photoconductive layer, and a second electrode transparent to visible light disposed beneath the second photoconductive layer. The cassette includes a first wall transparent to X-ray radiation facing the first electrode, a second wall transparent to visible light disposed parallel and opposite the first wall and facing the second electrode, and suitable connectors for providing an electrical potential between the first and second electrodes. Preferably, the X-ray recording device further includes isolating layers disposed between the electrodes and their respective photoconductive layers.

14 Claims, 4 Drawing Sheets

APPARATUS FOR RECORDING AND READING OUT A PATTERN OF PENETRATING ELECTROMAGNETIC RADIATION

This a continuation-in-part application of U.S. Ser. No. 08/657,550, filed Jun. 4, 1996, now abandoned.

FIELD OF THE INVENTION

The present invention relates to a method for recording a pattern of penetrating electromagnetic radiation in the form of an electrostatic charge pattern.

BACKGROUND OF THE INVENTION

Several devices for recording X-rays in the form of an electrostatic charge pattern have been disclosed. Basically two types of devices have been disclosed, a first type wherein charge images are generated by image-wise exposing the device to X-rays and a second type wherein an overall charge pattern is generated by an overall exposure to visible light and wherein the X-ray exposure creates a charge image by image-wise discharging the overall charges in the device.

In U.S. Pat. No. 3,069,551 an apparatus according to the first type, for intensifying images is disclosed, wherein two photoconductive layers A and B of different materials are separated by a thin mosaic T electrically conducting in the direction normal to its surface but insulating in the transverse direction. This anisotropic conductivity can be obtained by using a closely packed mosaic of evaporated metal such as is known in the art. The outer sides of the photoconducting layers carry transparent conducting layers F and G across which a D.C. voltage is applied from a source of potential E. In operation, one side of is irradiated continuously with the image radiation of a source $S_1$ which might be light or X-rays and which does not excite B. Charge is thus allowed to conduct across the layer A and mosaic T and built at the interface between T and B. The second photoconductive layer is scanned simultaneously with a spot of exciting radiation L from a source $S_3$ which discharges the build-up charge point by point as it moves across the layer B and gives electronic signals to an appropriate amplifier.

In U.S. Pat. No. 4,818,857 another device, according to the first type, is disclosed wherein an electrode is in contact with a layer of photoconductive material which is in close contact with a layer of dielectric material, comprising an electret and wherein said layer of dielectric material is contact with a second electrode. Upon an image-wise X-ray radiation, via the photoconductive layer, charges accumulate image-wise at the interface of the photoconductive layer and the dielectric layer. These charges can then be scanned and converted in an image.

In U.S. Pat. No. 4,508,966 still another device, according to the first type, is disclosed. This device comprises a single photoconductive layer sandwiched between two isolating layers. Each of the isolating layers carries an electrode. For X-ray recording a DC voltage is applied between the two electrodes, and by image-wise exposing the device to X-rays, a charge pattern is formed in the photoconductive layer, which can be read out and converted to a visible image.

In the periodical Research Disclosure, June 1983, item 23027 an energy transducer device, according to the second type, is characterized by :

(1) two contacting photoconductive layers of different spectral sensitivity, (2) each of said photoconductive layers stands in electrically conductive contact with a different electrically conductive support or layer, (3) at least one of said electrically conductive layers is transparent to radiation to which its contacting photoconductive layer is sensitive, (4) the other photoconductive layer can be irradiated through its contacting photoconductive layer or through its contacting support or layer to increase its conductivity, (5) a direct current (DC) source for applying a voltage difference between said conducting layers or supports, and (6) an electric-signal-detecting means, e.g. resistor, between one of the poles of said current source and one of said conductive layers or supports.

The method of operating said transducer device comprises the following steps :

(A) the overall exposure, i.e. overall exposure, of one of said photoconductive layers to light whereby it becomes uniformly electrically conductive while a DC voltage difference is applied between the electrically conductive supports or layers, (B) information-wise exposing the other photoconductive layer to electromagnetic radiation, e.g. X-rays, to which it is sensitive and to which the overall exposed photoconductive layer is substantially not sensitive while the support or layer in contact with the information-wise exposed photoconductive layer is connected to a means, e.g. ground, accepting charges leaking through the information-wise exposed photoconductive layer in correspondence with its exposed areas, and (C) scanning-wise exposing the overall exposed photoconductive layer with light to which it is sensitive and to which the other photoconductive layer is substantially not sensitive while with a current source a DC voltage is applied between said conductive supports or layers having a current signal detecting means, e.g. resistor, connected between one of the poles of said voltage source and one of said conductive supports or layers.

Said device is particularly suited for recording an X-ray pattern and transforming it in corresponding signal currents that can be amplified, stored and used in display on CRT-tube or for modulating a writing light beam in the production of a hard copy, e.g. on photographic silver halide emulsion film.

Another device of the second type is disclosed in the periodical Research Disclosure, April 1985, number 252, item 25235. This device comprises a first electrode, transparent to visible light in close contact with a first photoconductive layer sensitive to visible light, but not to X-rays. Said first photoconductive layer is in direct contact with a second photoconductive layer, sensitive to X-rays. Said second layer is in direct contact with a transparent electrode which in turn is in contact with a direct emitting X-ray phosphor. This device is overall exposed to light via said first photoconductive layer to form an overall charge pattern at the interface between the two photoconductive layers. Then upon image-wise X-ray exposure, charges leak away from said interface, said leaking away being helped by the visible light image-wise emitted by the direct emitting X-ray phosphor. The remaining charge image is then read out and converted to a visible image.

It is still desirable to improve X-ray recording devices of the second type, as described above, so that higher speed and a better signal-to-noise ratio (SNR) can be achieved.

SUMMARY OF THE INVENTION

It is an object of the present invention to provide a method for recording a pattern of penetrating electromagnetic radiation, e.g. an X-ray pattern, in the form of a charge pattern that is transformed in sequential analog or digital electrical signals, wherein the creation of a charge pattern by the radiation pattern and the reading of this charge pattern do not proceed simultaneously thereby keeping the exposure to penetrating radiation such as X-ray image exposure of short duration which is important to avoid image blur, e.g. in medical radiography, and effecting the read out later on in a location different from the exposure location and not limited by the duration of the imaging exposure.

It is a particular object of the present invention to provide a method for recording an X-ray pattern in the form of a charge pattern with a recording element contained in a cassette for use in X-ray tables for medical radiography.

It is a further object of the present invention to provide a device in the form of a cassette adapted for carrying out the method of the present invention and that can be loaded and unloaded from common X-ray tables.

Other objects and advantages of the present invention will appear from the further description and drawings.

According to the present invention a method is provided for recording X-ray images comprising the steps of:

(i) applying a DC potential between a first and a second electrode, said first electrode being transparent to X-rays and being in direct contact with an isolating layer, said isolating layer being in direct contact with a first layer of photoconductive material sensitive to X-rays, said first layer of photoconductive material being in direct contact with a second layer of photoconductive material sensitive to visible light, said second layer of photoconductive material being in direct contact with a layer of isolating material, said layer of isolating material being in direct contact with said second electrode, both said isolating material and said second electrode being transparent to visible light, (ii) overall exposing said second layer of photoconductive material, through said second electrode and said isolating material by visible light, for accumulating charges at the interface between said two photoconductive layers, (iii) image-wise exposing said first layer of photoconductive material to X-rays, during said overall exposure of said second photoconductive layer, for forming a charge image at said interface, (iv) reading said charge image by scanning said second photoconductive layer by visible light.

The objects of the invention are further realized by providing a device for recording X-rays comprising a DC-voltage source connected across a resistor to a first and a second electrode, said first electrode being transparent to X-rays and being in direct contact with a first isolating layer, said first isolating layer being in direct contact with a first layer of photoconductive material sensitive to X-rays, said first layer of photoconductive material being in direct contact with a second layer of photoconductive material sensitive to visible light, said second layer of photoconductive material being in direct contact with a second layer of isolating material, said second layer of isolating material being in direct contact with said second electrode, both said isolating material and said second electrode being transparent to visible light.

In this document the term "X-ray" has to be understood as any penetrating radiation and includes i.a. radiation originating from a radioisotope (e.g. a Co60 source), radiation created by an X-ray generator of any type, radiation and high energy particles created by a high energy radiation generator (e.g. Betatron), radiation from a sample labelled with a radioisotope as is the case in e.g. autoradiography.

DETAILED DESCRIPTION OF PREFERRED EMBODIMENTS OF THE INVENTION

In the prior art disclosures, referred to above, concerning X-ray recording devices, wherein an overall charge pattern is generated by an overall exposure to visible light and wherein the X-ray exposure creates a charge image by image-wise discharging the overall charges in the device, two photoconductive layers are in direct contact with each other and are each in direct contact with an electrode. It has been found that by the introduction of an isolating layer between one of the photoconductive layers and the associated electrode the performance of the device could be enhanced. Preferably two isolating layers are present, so that none of the photoconductive layers is in direct contact with the electrodes.

Figure 1:
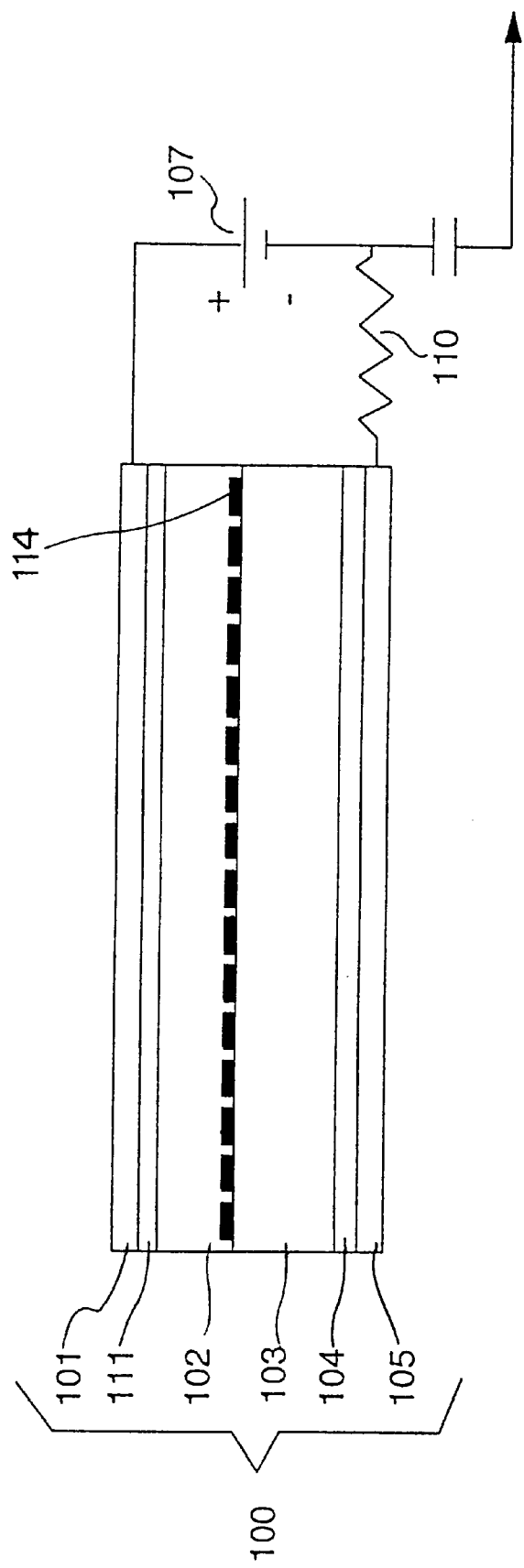
FIG. 1 repesents, schematically, an X-ray recording device according to the, present invention.

FIG. 1 shows a schematic view of a device 100 according to a preferred embodiment of the present invention. A voltage source 107, is connected to a first and second electrodes 101 and 105, respectively in the circuit, a resistor 110 is present. Said first electrode 101 is in direct contact with an isolating layer 111, said isolating layer being in contact with a first absorption layer 102, that is sensitive to X-rays (i.e. upon absorption of X-rays photoconductive layer 102 becomes conductive) and poorly sensitive to visible light (or poorly sensitive to a given wavelength (given wavelengths) in the visible spectrum). For the purposes of this disclosure, visible spectrum extends from near UV to near IR (i.e. wavelengths ranging from 350 nm to 850 nm). Photoconductive layer 102 is in direct contact with a second photoconductive layer 103. Photoconductive layer 103 is poorly sensitive to X-rays but sensitive to visible light in a part of the visible spectrum to which photoconductive layer 102 is not or is only poorly sensitive. Photoconductive layer 103 is in direct contact with an isolating layer 104, that carries said second electrode 105. The first electrode 101 is highly transparent to X-rays and may be in the form of a metal support, e.g. aluminium support having poor X-ray stopping power, carrying photoconductive layer 102. The electrode 105 is transparent to visible light, e.g. is a NESA-coating (vacuum deposited indium-tinoxide coating) on glass support. When the electrode 105 is applied on a glass support, said glass support is the isolating layer 104.

A device from which isolating layer 111 is omitted, thus wherein electrode 101 is in direct contact with photoconductive layer 102, is also within the scope of the invention. In that case, the signal to noise ratio (SNR) and speed of the recording device (i.e. the threshold amount of X-rays necessary to get a readable charge difference at the interface between the two photoconductive layers between the areas exposed to X-rays and the non-exposed areas) are lower, than the SNR and the speed of the device comprising two isolating layers, but a device with only one isolating layer is still workable for the recording of X-ray images.

According to a further embodiment of the invention, the panel-type recording device contains between the photoconductive layers 102 and 103 a uniform distribution of electrically conductive (metal) spots or micro-data 114 that are opaque to the applied flood light. These spots can be obtained by vacuum-evaporation of metal e.g. bismuth through a grid or by etching a uniformly applied metal layer, e.g. obtained by vacuum-deposition or electroless plating, using a known etching technique in combination with a removable photo-resist coating on top of said metal layer (ref. for electroless metal deposition U.S. Pat. No. 4,666, 735). By the presence of said "opaque" layer built up by closely located micro-dots 114 the flood light does not expose the photoconductive layer 102 in the area covered by said dots and the composition and spectral sensitivity of the photoconductor of photoconductive layer 102 may be the same as that of the photoconductor of photoconductive layer 103. However, these photoconductive layers may have a different thickness. The photoconductive layer 102 responsive to X-rays is normally thicker than the photoconductive layer 103 that is responsive to visible or infrared light.

In a device according to this invention, photoconductive layer 103 sensitive to visible light contains mainly (i.e. for at least a mass fraction of 50%) an organic photoconductor, and the photoconductive layer 102 that becomes conductive by irradiation with penetrating X-ray radiation contains mainly (i.e. for at least a mass fraction of 50%) a photoconductor including at least one element with an atomic number of 30.

In the recording device represented by FIG. 1 of the present specification the said photoconductive layer 103 contains or consists of a poorly X-ray sensitive photoconductor such as an organic photoconductor having a very low X-ray absorption because of the absence of high atomic number elements. A survey of organic photoconductors, monomeric as well as polymeric, is given e.g. in Chemiker Zeitung, July/August 1982, p. 275–287.

The spectral sensitivity of photoconductors has been discussed by S. K. Ghosh and W. E. Bixby in J. Applied Photogr. Eng., Vol. 6, No. 5, October 1980, p. 109–114 under the heading : "Spectral Sensitivity of Photoconductors as Used in Electrophotography". From FIG. 6 in said article appears that non-doped selenium has a sensitivity that runs out at about 600 nm, and from FIG. 7 can be learned that the spectral sensitivity of ZnO dispersed in polystyrene-polyethyl acrylate-polyvinyl acetate sensitized with a cyanine dye is very strong between 700 and 800 nm. From FIG. 9 can be learned that the relative sensitivity of 1:1 TNF:PVK compared to that of amorphous selenium by negative charging is about 150 to 6 at 632.8 nm (the wavelength of the helium-neon laser). 1:1 TNF:PVK stands for a molar mixture of tetranitrofluorenone with poly-N-vinylcarbazole.

Relative spectral sensitivity, also called spectral responsivity, of alpha-silicium, $As_2Se_3$, CdS, Se—Te and of a particular OPC (organic photoconductor) of KODAK is represented in FIG. 1–14 on page 20 of the book "Imaging Processes and Materials" Neblette's Eight Edition, Edited by John Sturge et al.—Van Nostrand Reinhold—New York (1989).

Useful photoconductors for X-ray recording, and thus for incorporation in photoconductive layer 102 are e.g. selenium, lead(II) oxide, and lead(II) iodide. The latter is faintly yellow and not sensitive to red light. It is preferably used in a hydrophobic insulating organic polymeric binder to exclude moisture that increases its conductivity. Other photoconductors for that purpose are described by R. M.Schaffert in the book "Electrophotography" 2nd rev. ed., The Focal Press—London and New York (1975), p. 191–198 and 313–326.

Photoconductors particularly useful for recording of X-rays with an X-ray spectrum of 20–35 kev, as applied normally in mammography, contain or consist of elements having an atomic number in the range of 30 to 40, e.g. selenium.

Photoconductors particularly useful for recording of X-rays with an X-ray spectrum of 40–100 keV, as applied normally in diagnosis of bone structure (e.g. chest radiography), contain or consist of elements having an atomic number above 45, e.g. cadmium, tellurium, lead and thallium. Thallous sulfide ($Tl_2S$) has been mentioned in the above mentioned book of R. M. Schaffert, p. 374 as a photoconductor having a spectral response in the wavelength range of about 0.6 to 1.4 μm whereby it is suited for scanning-wise exposure with infra-red laser beams of commercially available semiconductor lasers. It has been found by us that thallous sulfide (the atomic number of thallium is 81 and of lead is 82) is also a very useful X-ray photoconductor that may be applied in industrial (at more than 100 keV) as well as in medical radiography, e.g. chest radiography.

Figure 2:
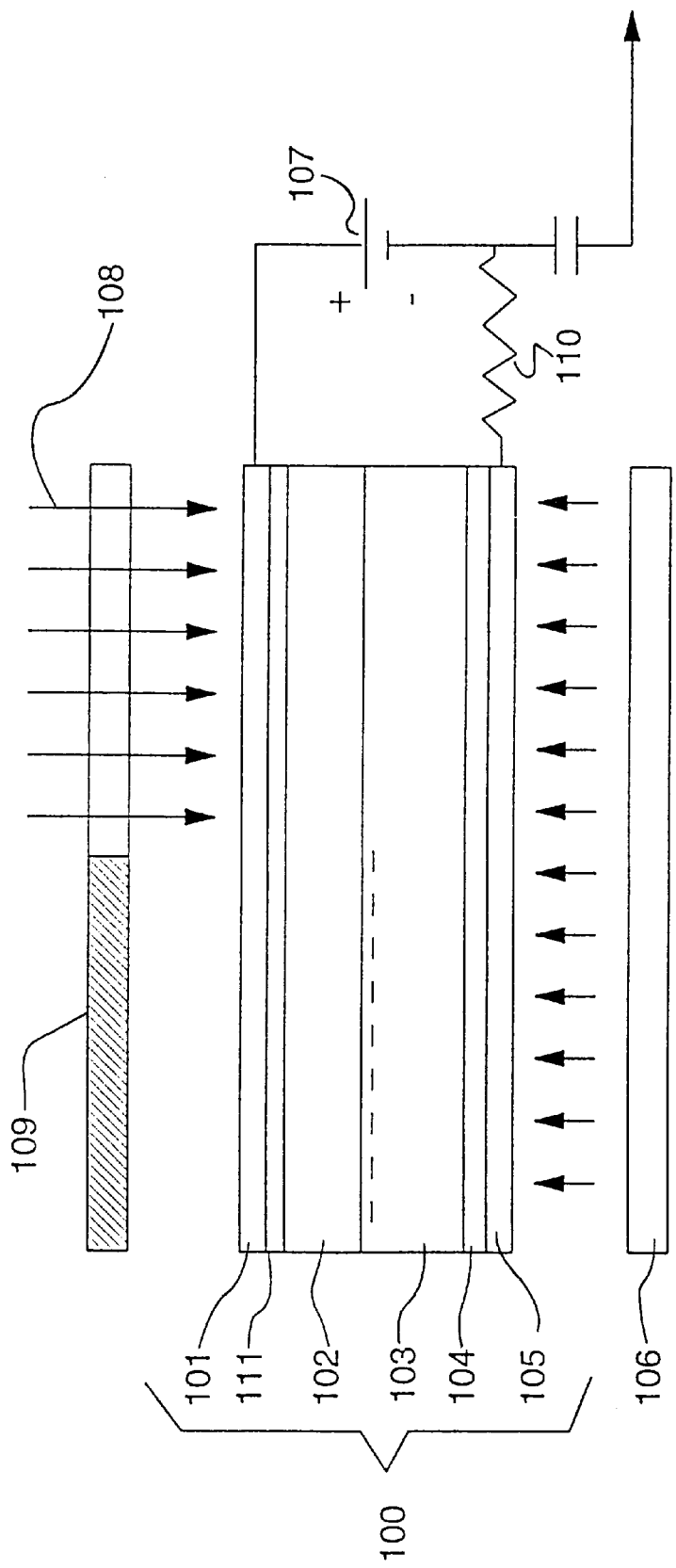
FIG. 2 represents, schematically, a method according to this invention, for recording X-rays as a charge image, using a device for recording, X-rays according to this invention.

In FIG. 2 a method, for using a device according to this invention, for the recording X-rays is schematically illustrated. A DC-voltage is applied by voltage source 107, across first and second electrodes 101 and 105, respectively. Said first electrode (101) is in direct contact with an isolating layer 111, said isolating layer being in contact with a first photoconductive layer 102, that is sensitive to X-rays (i.e. upon absorption of X-rays photoconductive layer 102 becomes conductive), photoconductive layer 102 is in direct contact with a second photoconductive layer 103. Photoconductive layer 103 is poorly sensitive to X-rays but sensitive to visible light in a part of the visible spectrum to which photoconductive layer 102 is not or is only poorly sensitive. Photoconductive layer 103 is in direct contact with an isolating layer 104, that carries said second electrode 105. The first electrode 101 is highly transparent to X-rays and may be in the form of a metal support, e.g. aluminium support having poor X-ray stopping power, carrying photoconductive layer 102. The electrode 105 is transparent to visible light, e.g. is a NESA-coating (vacuum deposited indium-tinoxide coating) on glass support. When the electrode 105 is applied on a glass support, said glass support is the isolating layer 104. While a DC-voltage is applied across said two electrodes 101 and 105, photoconductive layer 103 is overall exposed to visible light, via said second electrode, by a visible light source 106. The visible light source 106 can be e.g. a flood-light lamp or a high intensity flash lamp. This overall exposure creates an overall accumulation of charges of a given polarity at the interface between the two photoconductive layers 102 and 103. During the overall exposure, an object 109 is exposed to X-rays 108, via said first electrode. During the image-wise X-ray exposure and overall exposure to visible light, a direct current (DC) voltage source 107 maintains a voltage that causes in the X-ray exposed area a current to flow between the electrodes 101 and 105. In the area that is not exposed to X-rays or to a smaller extent the current is nil or proportionally less, a relatively strong charge image is built in the interface between the photoconductive layers 102 and 103.

The method can be used with any device according to the present invention, i.e. it can be used with a device comprising two isolating layers, as well as with a device wherein the isolating layer 111 between the electrode 101 and the photoconductive layer 102 is omitted, as well as with a device wherein between the two photoconductive layers an "opaque" layer is built up by closely located micro-dots.

The overall exposure to visible light of photoconductive layer 103, does not have to last as long as the image-wise X-ray exposure, but has to have an intensity sufficient to build a charge image in the interface of the photoconductive layers 102 and 103 which image has opposite image values with respect to the X-ray image. A shorter duration of the overall exposure to visible light of photoconductive layer 103 than the image-wise X-ray exposure or an overall exposure before the image-wise exposure to X-rays, also causes a charge image (but of opposite polarity to that of the non-exposed area) to be built in said interface in correspondence with the area exposed to X-rays.

In a further embodiment of the invention, the photoconductive layer sensitive to visible light generates upon exposure charges of one polarity and the X-ray sensitive photoconductive layer generates upon X-ray irradiation charges with opposite polarity. In the parts exposed to X-rays the charges at the interface of the two photoconductive layers are neutralized, thus forming a charge image. In the case that such photoconductive layers are used, the DC field is switched off during X-ray exposure or the polarity of the DC-field is changed during the X-ray exposure. This latter procedure enhances the speed of the method. The present invention also encompasses a method for X-ray recording with a device according to this invention wherein said overall exposure of said second photoconductive layer is terminated before starting said image-wise exposure to X-rays and wherein during said overall exposure of said second photoconductive layer a DC voltage of one polarity is applied over said electrodes and wherein during said image-wise exposure to X-rays a DC voltage the opposite polarity is applied over said electrodes.

Figure 3:
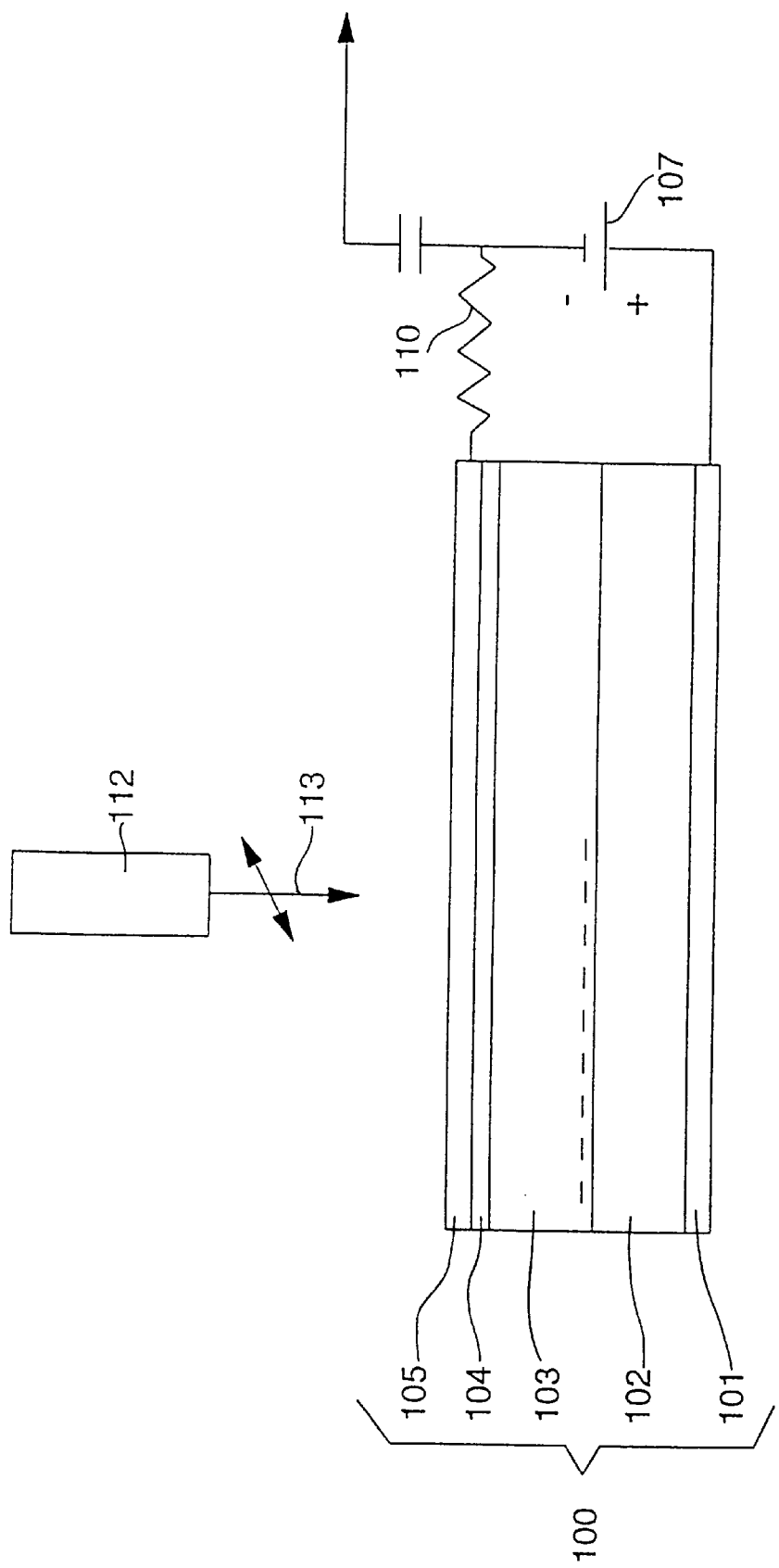
FIG. 3 represents, in a method according to this invention, the scanning stooge to read the charge image.

FIG. 3 represents a read-out stage wherein a scanning light beam 113 of a laser source 112 exposes the previously overall exposed photoconductive layer 103 and generates an image-wise modulated electrical current flowing through the signal resistor 110 without disconnecting the voltage source 107.

During the scanning, negative charges originating from the negative pole of the voltage source neutralize positive charges in the X-ray exposed area and equalize the charge level of negative charges over the whole interface between the photoconductive layers, thereby through the signal resistor operating in series with the DC-voltage source an image-wise modulated analog voltage signal is generated. The electrical voltage signal obtained in the read-out of the charge image can be electronically amplified by means known in the art. The signal obtained in the scanning-wise exposure is in analog form. For transformation in digitized form an analog signal is divided into a number of adjoining intervals called quantization levels. The total number of quantization levels defines the grey scale i.e. the number of shades that can be represented. A grey scale of 64 levels can yield a fairly realistic reproduction. The quantization levels are represented by a set of binary numbers whereby the analog signal becomes digitized and as such can be stored in the memory unit of a computer. The data can then be processed to obtain a new set of digital values, which in turn can generate a revised image.

Accurate and reliable devices for sampling and quantizing an image or for displaying an image reconstructed from digital data have been commercially available for more than one decade.

Once an image has been digitized and transmitted to a computer various mathematical operations can be carried out on the data in order to improve the visual quality of the image. For example, the contrast of the whole or a part of the image can be enhanced.

By subtracting the minimum brightness value from each pixel (elementary image point) and then multiplying the brightness value of each pixel by a constant, the digital data are spread over a wider range and the resulting image has a greater image contrast (average gradient is enlarged).

A further possibility of mathematical manipulation of an image in digitized form resides in the possibility to register image points that are geometrically shifted as a consequence of the different angle of exposure with respect to the exposure source. Numerical analysis of the different exposure situation for each detector area makes it possible to introduce a computer algorithm that brings the different detector area into the same angle of exposure situation. By the same technique blur caused by movement of the original can be cancelled when the equations of motion (extent and direction) are known or can be measured.

For use in medical radiography the above described panel-like X-ray recording device(s) is (are) preferably used in a cassette.

The cassette is operated with an external flood light source for the overall exposure, arranged underneath the photoconductive recording device in a "universal stand" X-ray table replacing or combined with a Bucky grid (see for a universal tiltable X-ray table the book "Medical X-Ray Technique—Principles and Applications by G. J. Van der Plaats (1959) Philips' Technical Library—The Netherlands, p.274–275).

According to a special embodiment the cassette internally contains a flood light source for overall exposure, e.g. in the form of an electroluminescent panel, uniformly emitting light all over its surface directed towards the photoconductive layer that is sensitive to visible light.

A cassette which can be applied for including a removably positioned panel-like recording device for use according to the present invention is described in U.S. Pat. No. 5,065,866. In the cassette according to U.S. Pat. No. 5,065,866 the panel-like recording device applied in the present invention replaces a photo-stimulable phosphor plate.

According to a particular embodiment an X-ray cassette of the present invention comprises (i) a generally flat rectangular housing having a first and a second major wall being plane and parallel to each other, said first wall being transparent to X-rays, and said second wall being transparent to visible light and/or infrared light, (ii) a first and a second side wall permanently sustaining said major walls and leaving room for a flat insertable panel, and (iii) a first end wall permanently connected to said major walls and said side walls forming a pocket for inserting therein said panel, iv) a second end wall being mounted such that it can be separated from said pocket and being attached to an X-ray recording device comprising a DC-voltage source connected over a resistor to a first and a second electrode, said first electrode being transparent to X-rays and being in direct contact with a first isolating layer, said first isolating layer being in direct contact with a first layer of photoconductive material sensitive to X-rays, said first layer of photoconductive material being in direct contact with a second layer of photoconductive material sensitive to visible light, said second layer of photoconductive material being in direct contact with a second layer of isolating material, said second layer of isolating material being in direct contact with said second electrode, both said isolating material and said second electrode being transparent to visible light and wherein said X-ray recording device is placed in the cassette such that said second layer of photoconductive material sensitive to visible light faces said second major face of the cassette. The connection of said DC-voltage source to said electrodes can proceed a plug socket making part of said separatable end wall.

According to a further embodiment an X-ray cassette of the present invention comprises:

(i) a generally flat rectangular housing having a first and a second major wall being plane and parallel to each other, said first wall being transparent to X-rays, and said second wall containing an electroluminescent panel, uniformly emitting light all over its surface, (ii) a first and a second side wall permanently sustaining said major walls and leaving room for a flat insertable panel, and (iii) a first end wall permanently connected to said major walls and said side walls forming a pocket for inserting therein said panel, iv) a second end wall being mounted such that it can be separated from said pocket and being attached to an X-ray recording device comprising a DC-voltage source connected across a resistor to a first and a second electrode, said first electrode being transparent to X-rays and being in direct contact with a first isolating layer, said first isolating layer being in direct contact with a first layer of photoconductive material sensitive to X-rays, said first layer of photoconductive material being in direct contact with a second layer of photoconductive material sensitive to visible light, said second layer of photoconductive material being in direct contact with a second layer of isolating material, said second layer of isolating material being in direct contact with said second electrode, both said isolating material and said second electrode being transparent to visible light and wherein said X-ray recording device is placed in the cassette such that said second layer of photoconductive material sensitive to visible light faces said second major face of the cassette. The connection of said DC-voltage source to said electrodes can be accomplished a plug socket that is part of said separable end wall.

Thus the invention encompasses an X-ray recording device according to the present invention, removably placed in a cassette, so that the photoconductive layer being sensitive to visible light faces a wall of said cassette, transparent to visible light.

The invention further encompasses an X-ray recording device according to the present invention, removably placed in a cassette, so that the photoconductive layer being sensitive to visible light faces a wall of said cassette, said wall containing an electroluminescent panel, uniformly emitting light all over its surface.

Figure 4:
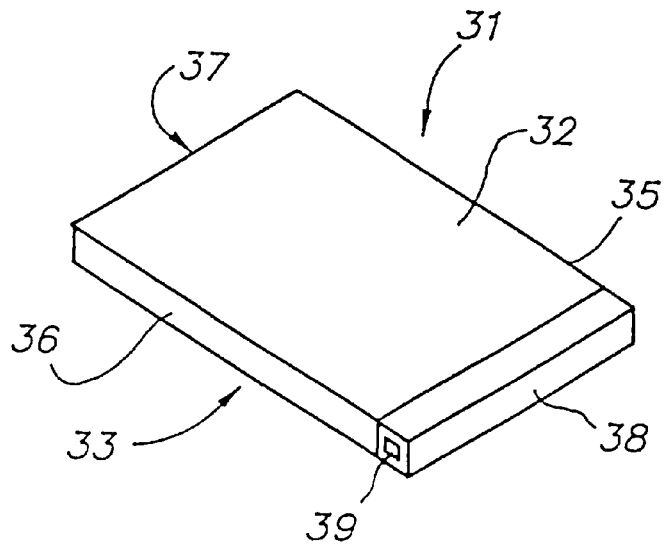
FIG. 4 represents in perspective view a cassette including an X-ray recording device according to the present invention. The cassette is in "closed" condition.

FIG. 4 illustrates such a cassette in "closed" condition. The cassette includes a housing (shell) 31 which is hollow and which is of rectangular configuration. Shell 31 has a pair of facing walls 32 and 33 between which a panel-type recording device 34 according to the present invention (not seen in FIG. 4) is sandwiched. The upper wall 32 is transparent to X-rays and the bottom wall 33 is transparent to visible and/or infrared light and faces photoconductive layer 103 of FIG. 1. The shell 31 has a pair of side walls (35, 36) and end walls (37, 38) at least one of which can be gripped and mechanically separated from the shell 31 taking with it the panel-type device 34 as shown in FIG. 4. The electrodes of the panel-type recording device according to the present invention can be connected to the poles of a DC voltage source through a plug socket 39 located in separable end wall 38.

Figure 5:
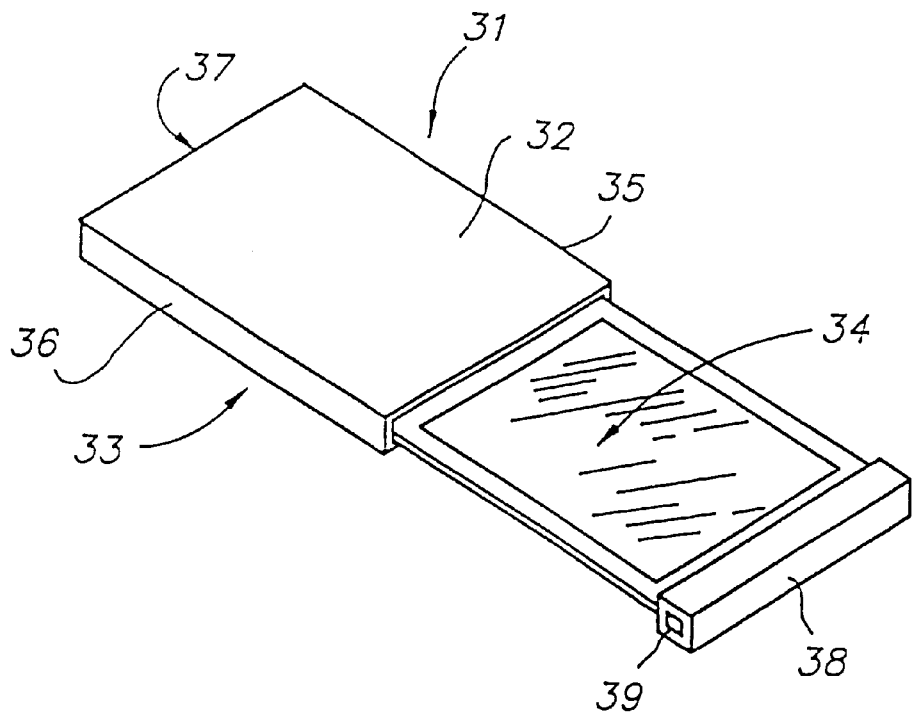
FIG. 5 represents the same cassette as FIG. 4, but in "opened" condition for read-out of the obtained charge image.

FIG. 5 represents the opened form of the cassette in which the charge image is read-out by scanning laser beam impinging through the transparent (supported) electrode on the photoconductive layer that has been exposed with overall.

An X-ray cassette having resemblance to the one of the present invention is disclosed in European patent specification 0 394 564 and corresponding U.S. Pat. No. 4,827,136.

We claim:

1. An apparatus for recording X-ray images comprising:
   a panel-like X-ray recording device comprising:
      a first electrode transparent to X-ray radiation;
      a first photoconductive layer sensitive to X-ray radiation disposed beneath said first electrode;
      a second photoconductive layer sensitive to visible light disposed beneath said first photoconductive layer;
      a second electrode transparent to visible light disposed beneath said second photoconductive layer; and
   a cassette for removably installing and housing said X-ray recording device, said cassette comprising:
      a first wall transparent to X-ray radiation facing said first electrode;
      a second wall transparent to visible light disposed parallel and opposite said first wall and facing said second electrode; and
      connecting means for providing an electrical potential between said first and second electrodes.

2. The apparatus according to claim 1, wherein said cassette further comprises an electroluminescent panel disposed on said second wall for uniformly emitting light over said second photoconductive layer.

3. The apparatus according to claim 1, wherein said X-ray recording device further comprises a first isolating layer transparent to visible light disposed between said first electrode and said first photoconductive layer.

4. The apparatus according to claim 1, wherein said X-ray recording device further comprises a second isolating layer transparent to visible light disposed between said second electrode and said second photoconductive layer.

5. The apparatus according to claim 1, further comprising a DC power supply and a resistor connected in series between said first and second electrodes for providing said electrical potential.

6. The apparatus according to claim 1, further comprising an opaque layer disposed between said first and second photoconductive layers.

7. The apparatus according to claim 6, wherein said opaque layer is a layer of closely located micro-dots.

8. The apparatus according to claim 7, wherein said micro-dots are bismuth micro-dots.

9. The apparatus according to claim 1, wherein said second photoconductive layer comprises an organic photoconductor.

10. The apparatus according to claim 9, wherein the mass fraction of said organic photoconductor is at least 50%.

11. The apparatus according to claim 1, wherein said first photoconductive layer comprises a photoconductor having a mass fraction of at least 50%.

12. The apparatus according to claim 11, wherein said photoconductor includes zinc.

13. The apparatus according to claim 1, wherein said first photoconductive layer comprises thallous sulfide.

14. The apparatus according to claim 1, wherein said first photoconductive layer comprises an element having an atomic number greater than or equal to 30.

* * * * *